(12) United States Patent
Schnitt et al.

(10) Patent No.: US 11,315,847 B2
(45) Date of Patent: Apr. 26, 2022

(54) CHIP SCALE PACKAGE

(71) Applicant: NEXPERIA B.V., Nijmegen (NL)

(72) Inventors: Wolfgang Schnitt, Hamburg (DE); Tobias Sprogies, Hamburg (DE)

(73) Assignee: Nexperia B.V., Nijmegen (NL)

( * ) Notice: Subject to any disclaimer, the term of this patent is extended or adjusted under 35 U.S.C. 154(b) by 334 days.

(21) Appl. No.: 15/932,286

(22) Filed: Feb. 16, 2018

(65) Prior Publication Data

US 2018/0233426 A1 Aug. 16, 2018

(30) Foreign Application Priority Data

Feb. 16, 2017 (EP) ..................... 17156559

(51) Int. Cl.
| | |
|---|---|
| *H01L 23/31* | (2006.01) |
| *H01L 25/065* | (2006.01) |
| *H01L 23/538* | (2006.01) |
| *H01L 23/29* | (2006.01) |
| *H01L 25/00* | (2006.01) |
| *H01L 21/56* | (2006.01) |

(52) U.S. Cl.
CPC ........ *H01L 23/3114* (2013.01); *H01L 21/561* (2013.01); *H01L 21/568* (2013.01); *H01L 23/291* (2013.01); *H01L 23/5385* (2013.01); *H01L 23/5386* (2013.01); *H01L 25/0655* (2013.01); *H01L 25/50* (2013.01); *H01L 2224/0401* (2013.01); *H01L 2224/16227* (2013.01); *H01L 2224/94* (2013.01)

(58) Field of Classification Search
CPC ............. H01L 23/3114; H01L 23/5385; H01L 23/5386; H01L 23/0655; H01L 25/50; H01L 25/0655
See application file for complete search history.

(56) References Cited

U.S. PATENT DOCUMENTS

| | | |
|---|---|---|
| 5,956,605 A | 9/1999 | Akram et al. |
| 2008/0315334 A1 | 12/2008 | Martin |
| 2011/0221055 A1* | 9/2011 | Lin ................... H01L 21/563 257/692 |
| 2014/0183718 A1 | 7/2014 | Han et al. |
| 2016/0380119 A1 | 12/2016 | Jung et al. |

FOREIGN PATENT DOCUMENTS

CN 105304585 A 2/2016

\* cited by examiner

*Primary Examiner* — Hoa B Trinh
(74) *Attorney, Agent, or Firm* — Ohlandt, Greeley, Ruggiero & Perle, LLP

(57) ABSTRACT

The disclosure relates to chips scale packages and methods of forming such packages or an array of such packages. The semiconductor chip scale package comprises: a semiconductor die, comprising: a first major surface opposing a second major surface; a plurality side walls extending between the first major surface and the second major surface; a plurality of electrical contacts arranged on the second major surface of the semiconductor die; and an inorganic insulating material arranged on the plurality of side walls and on the first major surface.

15 Claims, 4 Drawing Sheets

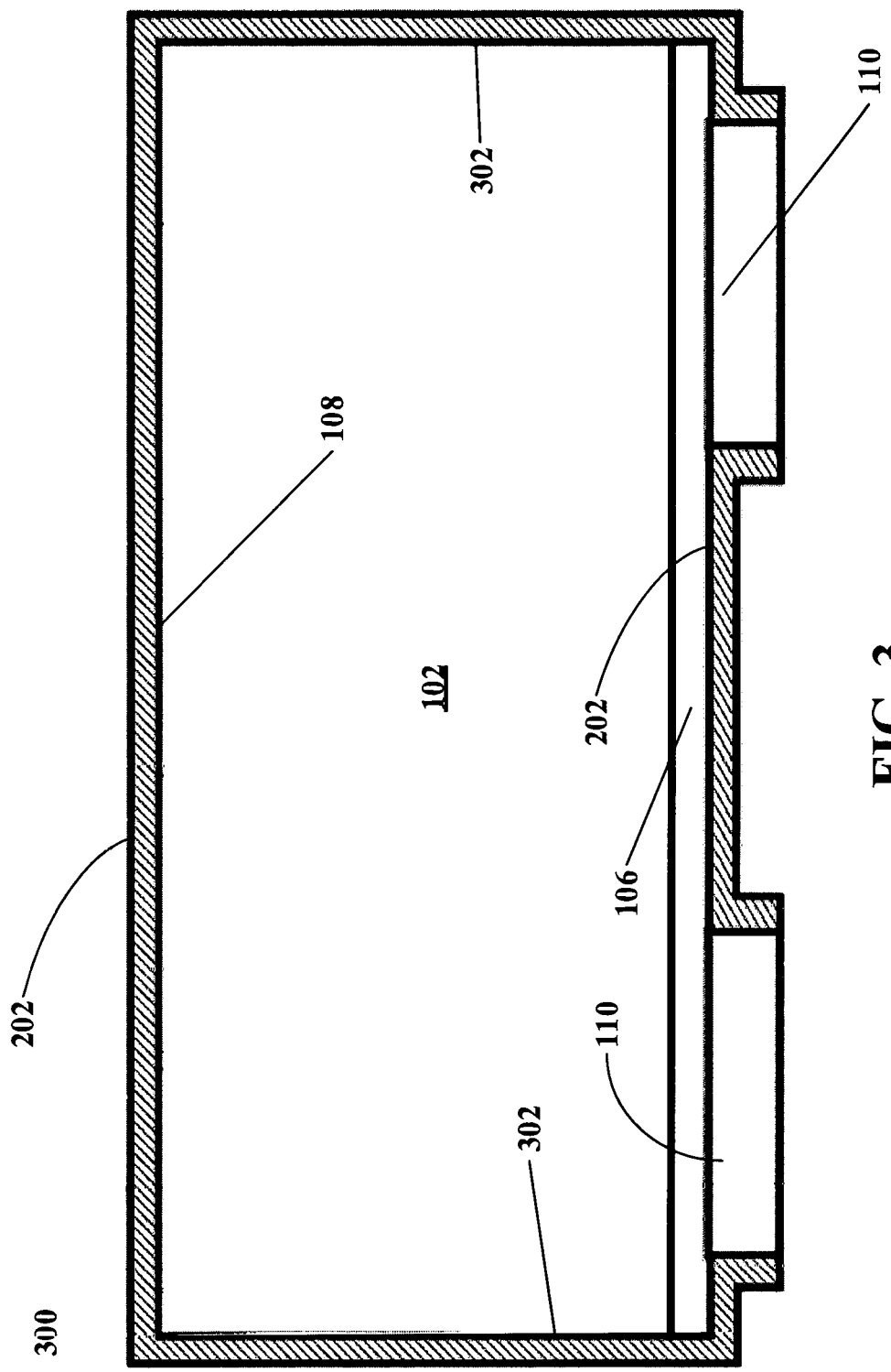

CHIP SCALE PACKAGE

CROSS REFERENCE TO RELATED APPLICATION

The present application claims priority under 35 U.S.C § 119 to European Patent Application 17156559.1, filed on Feb. 16, 2017, the entirety of which is incorporated by reference hereby.

FIELD

The present invention relates to a semiconductor chip scale package. In particular the invention relates an array of such semiconductor chip scale packages arranged on a carrier. The invention also relates to a method of forming an array semiconductor chip scale packages.

BACKGROUND

Plastic packages are used to encapsulate semiconductor dies and protect the dies against damage. However, such packaged semiconductor dies have limitations particularly where there are space restrictions for mounting the package on for example a PCB. In a traditional plastic package, the thickness of the epoxy mould compound is in order of 10 μm up to several 100 μm. Thus, traditional plastic packages are unsuitable for applications with space restrictions.

Semiconductor chip scale packages are generally very close to the size of semiconductor die and provide a solution where there are space restrictions for mounting the package because the package volume is nearly identical to the volume of the semiconductor die. A known definition of a chip scale package is that the package must have an area no greater than 1.2 times that of the semiconductor die forming the package and the package must contain a single die and be capable of direct surface mounting on a carrier, such for example a printed circuit board (PCB).

Following dicing of a semiconductor wafer to form the individual semiconductor dies, and in order to achieve these size requirements, surfaces of the semiconductor die, and particularly the side walls of the die may be unprotected. As a result, there is a risk of short circuits, which can adversely impact on device performance and functionality, between contacts, such as solder pads, of the semiconductor die and regions of the semiconductor die itself. For example, unprotected surfaces of the die may come into electrical contact with the solder on the solder pads during mounting on a carrier. This unwanted electrical contact may result in unwanted current paths and/or leakage currents which may inhibit device performance or even render the device inoperable.

SUMMARY

According to a first aspect there is provided a semiconductor die, the semiconductor die comprising: a first major surface opposing a second major surface; a plurality side walls extending between the first major surface and the second major surface; a plurality of electrical contacts arranged on the second major surface of the semiconductor die; and an inorganic insulating material arranged on the plurality of side walls and on the first major surface.

Optionally, the insulating material may be a metal oxide material. The insulating material may comprise an aluminium oxide, such as $Al_2O_3$. Alternatively, the insulating material may comprise an $Al_2O_3$ layer and a $TiO_2$ layer. The insulating material may comprise an alternating arrangement of $Al_2O_3$ layers and $TiO_2$ layers.

Optionally, the inorganic insulating material may be arranged on the second major surface such that the electrical contacts are free of insulating material. Alternatively, the second major surface may be free of insulating material.

Optionally, the thickness of the insulating material may be proportional to an operating voltage of the semiconductor die.

Optionally, the insulating material may be formed as a conformal layer on the semiconductor die by atomic layer deposition or low temperature PECVD.

According to a second aspect there is provided an array of semiconductor chip scale packages according to first aspect, comprising a plurality of chip scale packages formed on a carrier, wherein the electrical contacts are in contact with the carrier.

According to a third aspect there is provided a method of forming an array of chip scale packages, the method comprising: mounting a semiconductor wafer on a carrier; singulating the semiconductor wafer to form a plurality semiconductor dies, wherein each of said plurality of singulated semiconductor dies comprises; a first major surface opposing a second major surface; a plurality side walls extending between the first major surface and the second major surface; a plurality of electrical contacts arranged on the second major surface of the semiconductor die; and an inorganic insulating material arranged on the plurality of side walls and on the first major surface.

Optionally, the insulating material may be a metal oxide material. The insulating material may comprise an aluminium oxide, such as Al2O3. Alternatively, the insulating material may comprise an Al2O3 layer and a $TiO_2$ layer. The insulating material may comprise an alternating arrangement of Al2O3 layers and $TiO_2$ layers.

Optionally, the inorganic insulating material may be arranged on the second major surface such that the electrical contacts are free of insulating material. Alternatively, the second major surface may be free of insulating material.

Optionally, the thickness of the insulating material may be proportional to an operating voltage of the semiconductor die.

Optionally, the insulating material may be formed as a conformal layer on the semiconductor die by atomic layer deposition or low temperature PECVD.

DESCRIPTION OF THE DRAWINGS

The invention is described further hereinafter by way of example only with reference to the accompanying drawings in which:

FIG. 3 illustrates a side view of a chip scale package; and

Elements shown in the figures may not be drawn to scale, unless otherwise indicated. In the figures and the following description like reference numerals refer to like features.

DETAILED DESCRIPTION OF THE DISCLOSURE

Figure 1A:
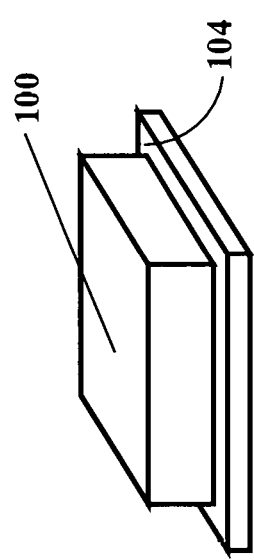
FIG. 1A illustrates a semiconductor wafer.
Figure 1B:
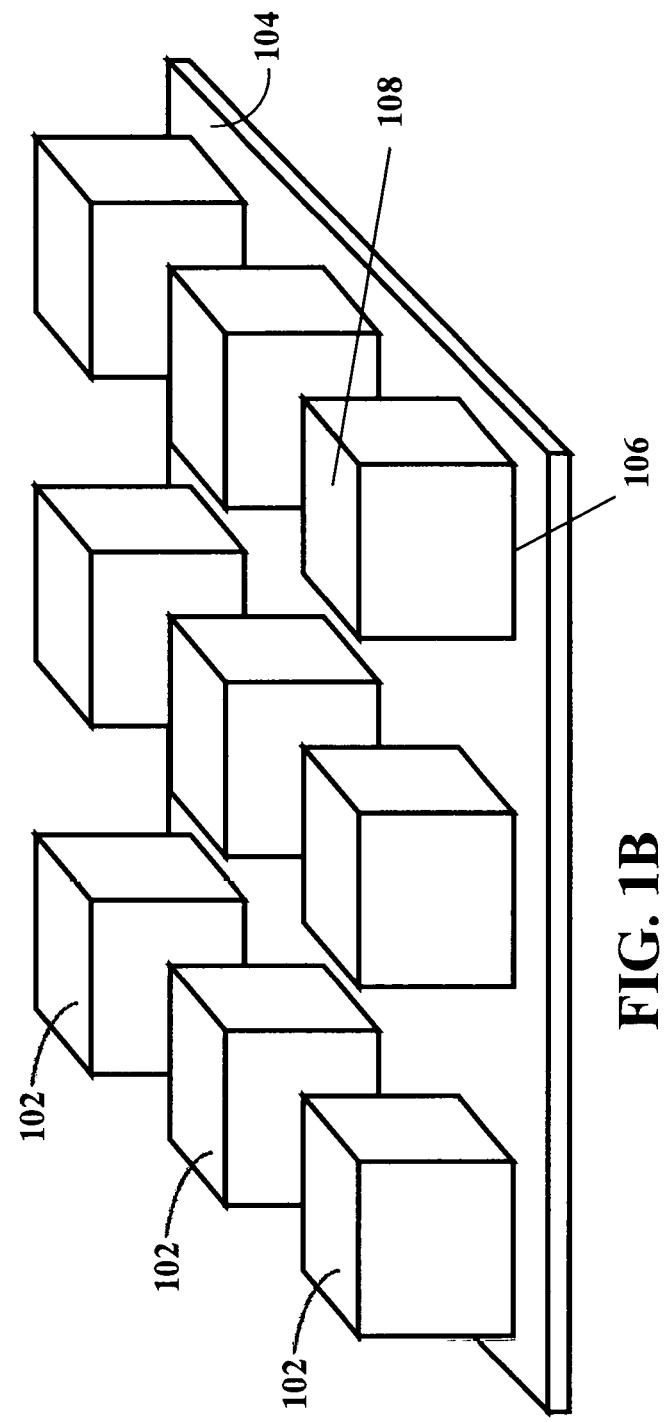
FIG. 1B illustrates a semiconductor wafer singulated into semiconductor dies.

FIG. 1A shows a fabricated semiconductor wafer 100 before singulation and FIG. 1B shows the semiconductor wafer 100 after singulation into individual semiconductor dies 102. The semiconductor wafer 100 may be singulated by any appropriate dicing process such as for example plasma dicing, laser dicing, chemical etching or mechanical sawing which are well known to those skilled in the art of semiconductor chip scale packages.

The fabricated semiconductor wafer 100 may be placed on a carrier 104. The carrier 104 ensures that the relative positions of the semiconductor dies 102 are fixed. Whilst FIGS. 1A and 1B illustrate a rectilinear semiconductor wafer 100 and a three by three (3×3) array of singulated semiconductor dies 102, the skilled person will appreciate that other geometries, such as circular 200 mm or 300 mm diameter wafers, and array sizes containing for example tens of thousands of semiconductor dies 102, are possible. Each of the semiconductor dies 102 may comprise an active side 106, comprising the active electrical function of the device, and a non-active side 108 which may comprise for example the substrate material for forming the fabricated semiconductor wafer 100. Contacts (not illustrated in FIGS. 1A and 1B) such as solder pads may be formed on the active side 106 of the semiconductor dies 102 between the carrier 104.

Figure 2A:
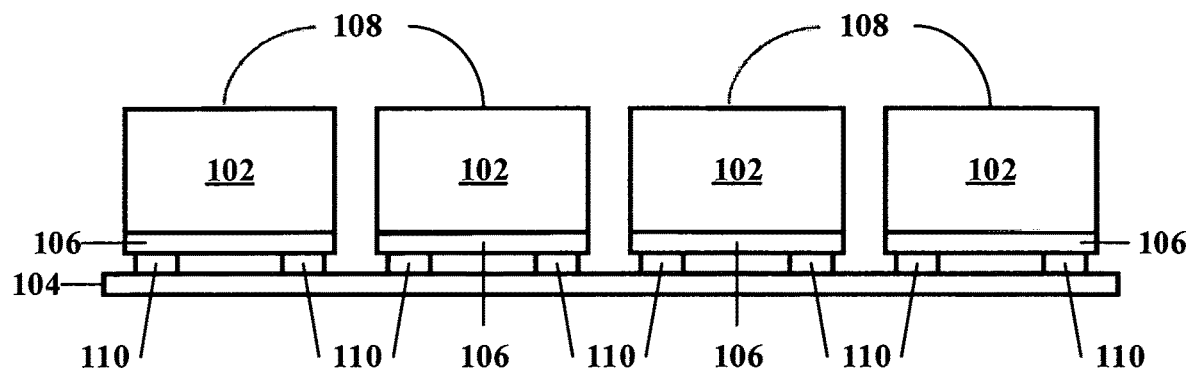
FIG. 2A illustrates a side view of a semiconductor wafer singulated into semiconductor dies.

The singulated semiconductor dies 102 of FIG. 1B are shown in side view in FIG. 2A. Contacts 110, such as solder pads, are arranged on the active side 106 of the semiconductor dies 102, between the active side 106 and the sawing foil 104. In this regard the active side 106 of a semiconductor die 102, is said to be facing downward, that is, towards the carrier 104, and the non-active side of a semiconductor die 102 is said to be facing upwards. The contacts 110 may be solder pads, pillars, balls in a ball grid array (BGA) or solder bumps formed. The contacts may be formed by any appropriate process such as a galvanic metallisation process or a sputtering process.

The carrier 104 may be any appropriate material so as to maintain the relative positions of the semiconductor dies 102. For example the carrier 104 may be a so-called sawing foil. Following singulation the semiconductor die 102 may optionally be removed from the carrier 104 and transferred to a tape for later assembly on a PCB using a pick and place machine.

Figure 2B:
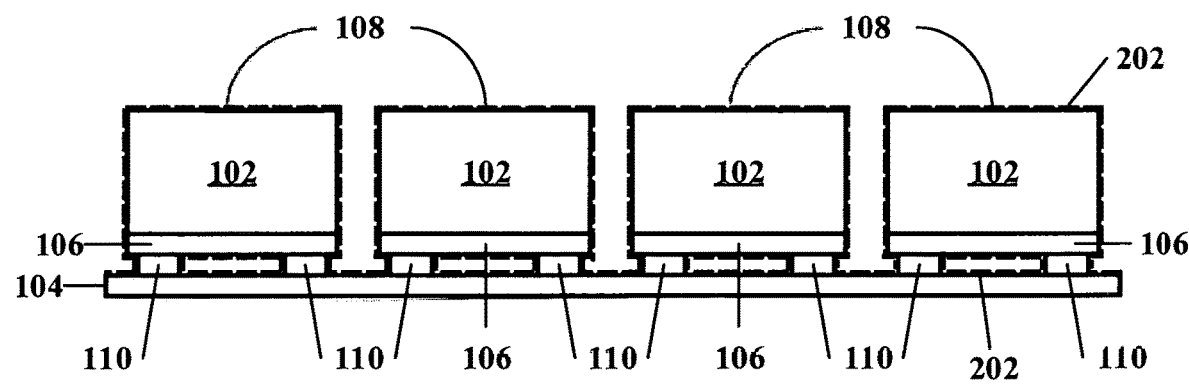
FIG. 2B illustrates a side view of a semiconductor wafer singulated into semiconductor dies with a deposited insulation material.

Following singulation, or as optionally mentioned above, transfer to a reel, and whilst the semiconductor dies 102 are still arranged on the carrier 104, or optionally following transfer to a tape, the semiconductor dies 102 may be coated with an electrically insulating material 202 as illustrated in FIG. 2B. The carrier or tape may be any appropriate polymeric film.

The insulating material 202 may be applied by a deposition process. The deposition process may be an atomic layer deposition (ALD) process such as a low temperature (less than 100° C.) ALD. The deposition process may be chosen such that temperature during deposition does not exceed the maximum temperature rating of carrier or tape. Certain UV carriers may have a maximum temperature rating of 100° C. whereas polyimide tapes such as Kapton™ type carriers may have a maximum temperature rating of 300° C.

When exposed to high temperatures carriers and in particular polymeric carriers (or tapes) may deform or even melt. Any deformation of the carrier or tape may result in unpredictable changes in relative positions of the semiconductor dies 102. This may have adverse effects on the accuracy of placement of the semiconductor dies 102 on to a PCB during a pick and place process, where precise placement is essential. In this context low temperature is defined as temperature within the operating temperate of the carrier material. A low temperature ALD may therefore ensure that the carrier 104 (or the tape) can withstand the deposition process and does not degrade or deform. As a result the insulating material can be formed on the semiconductor dies 102 after singulation with the semiconductor dies 102 still in place on the carrier 104 (or the tape) such that no rearrangement of the relative positions of the semiconductor dies is necessary.

As an alternative to polymeric carriers mentioned above, the carriers may be rigid type carriers such as a semiconductor substrate or a glass material. In this case the semiconductor dies 102 may be bonded to the carrier by an epoxy type glue. As with, polymeric type carriers epoxy type glues may degrade or deform when heated. Therefore using a low temperature ALD may therefore ensure that the glue can withstand the deposition process and does not degrade or deform. As a result the insulating material can be formed on the semiconductor dies 102 after singulation with the semiconductor dies 102 still fixed to a carrier by a glue such that no rearrangement of the relative positions of the semiconductor dies is necessary.

Low temperature plasma-enhanced chemical vapor deposition (PECVD) may be used as an alternative to ALD As discussed above the semiconductor die 102 may be placed on a carrier 104 such that the contacts 110 formed on the active side 106 of the semiconductor die 102 are in contact with the carrier 104. This results the semiconductor dies 102 being raised above carrier 104 by the height of the contacts such that the active side 106 of the semiconductor die 102 not having contacts is exposed. In addition, the non-active side and the side-walls of the semiconductor die 102 will also be exposed. In other words, the above mentioned arrangement of semiconductor die 102 mounted on a carrier 104 the contacts 110 are in direct contact with the carrier 104 and are thus protected from deposition of the insulating material. In effect, the arrangement of contacts 110 on the carrier acts as a mask to prevent deposition of the insulating material such that the contacts will be free from insulating material. That is, where will be no insulation material on the contacts 110 where they are attached to the carrier 104.

Consequently, when the semiconductor dies are removed from the carrier 104, the portions of the contacts 110 in contact with the carrier 104 will be free of, that is not be covered with, the insulating material 202. This arrangement thereby allows for mounting of the semiconductor dies to be using the contacts 110 onto for example a PCB, without the need for further costly and time consuming processing steps of removing the insulating material from the contacts. Furthermore, because insulating material is not deposited on the on the contacts, the thickness and composition of the insulating material may be chosen to fulfil requirements of electrical isolation (as discussed below), as well as for example any one or more of hermeticity, diffusion inhibition, mechanical protection and surface conditioning, without hampering the ability to solder the device to for example a PCB.

Furthermore, as shown in FIG. 2B, the insulating material 202 will also be deposited on the carrier 104. However, following subsequent removal of the semiconductor die, during a pick and place process, the carrier 104 have insulating material 202 deposited thereon may be discarded or recycled as appropriate.

Typically soldering of the completed insulated package is carried out by a reflow process following mounting, on for example a PCB, and may typically be carried out at a temperature of approximately 260° C. over a period of approximately 30 seconds.

Insulating materials containing $Al_2O_3$ and/or $TiO_2$ (or other metal oxides) are resistant to temperatures achieved during soldering.

Alternatively, where glue is used to fix the die to the carrier the contacts 110 may be embedded in glue layer on the carrier 104 such that the active side of the semiconductor dies 102 and contacts 110 are not exposed. Consequently, when the semiconductor dies are removed from the carrier 104, the active side 106 including the contacts 110 will be free of, that is not be covered with, the insulating material 202.

The above arrangements may result is a device which is easier to mount on a PCB because there is no insulating material on the contacts, that is the contacts may be free from insulating material. In addition, and as mentioned the semiconductor die is protected from solder during the soldering process and the die may also die protected from unwanted current paths.

Consistent with the foregoing discussion, FIG. 3 illustrates a completed chip scale package 300 that includes the insulating material 202 which is deposited on each of the sidewalls 302 (four sidewalls in the present example). In addition, the insulating material 202 may also be deposited the non-active side of the semiconductor die 102. The skilled person will appreciate that the location of the deposition of the insulating material 202 may be controlled by a mask, such that some or all portions of the side walls and/or non-active side may be coated with the insulating material 202.

The active side of the chip scale package 300 comprises one or more contacts 110 arranged thereon to achieve electrical connection to the active side 106 of the chip scale package 300. The insulating material is also arranged on the active side of the of chip scale package 300 outside the contact 110. In other words the insulating material is not deposited on the contacts, consistent with the process described above. The active side and the non-active side may be arranged as opposing major surfaces and the side walls may be arranged as opposing minor surfaces.

Where a plasma dicing process is used, the arrangement of side walls may not be rectilinear or symmetrical. Indeed with such process round devices (when viewed from the top) are also possible.

In the context of the present disclosure use of the term the active side is used to refer to the region of the chip scale package on which the contacts are formed, whereas the non-active side is used to refer to region of the device which does not have contacts. However, the skilled person will appreciate that the non-active side may contain active regions of the device, that is, regions which solely or in combination with another region of the device, contribute to device functionality.

For ease of illustration, the carrier 104 is not illustrated in FIG. 3 and the skilled person will appreciate that the competed chip scale package 300 may be arranged as an array of like chip scale packages on such a carrier. Furthermore, the carrier may be removed as an additional processing step.

The above described processes and arrangements are suitable for application in chip scale packages such as surface mount devices used for transistors, multi-channel devices or integrated circuits. By way of example only one application may be transient voltage suppression (TVS) devices, which provide protection against electrical overstress or electrostatic discharges and are commonly used in portable/consumer electronic devices such as personal computers, audio and video equipment or mobile telephones.

Figure 4:
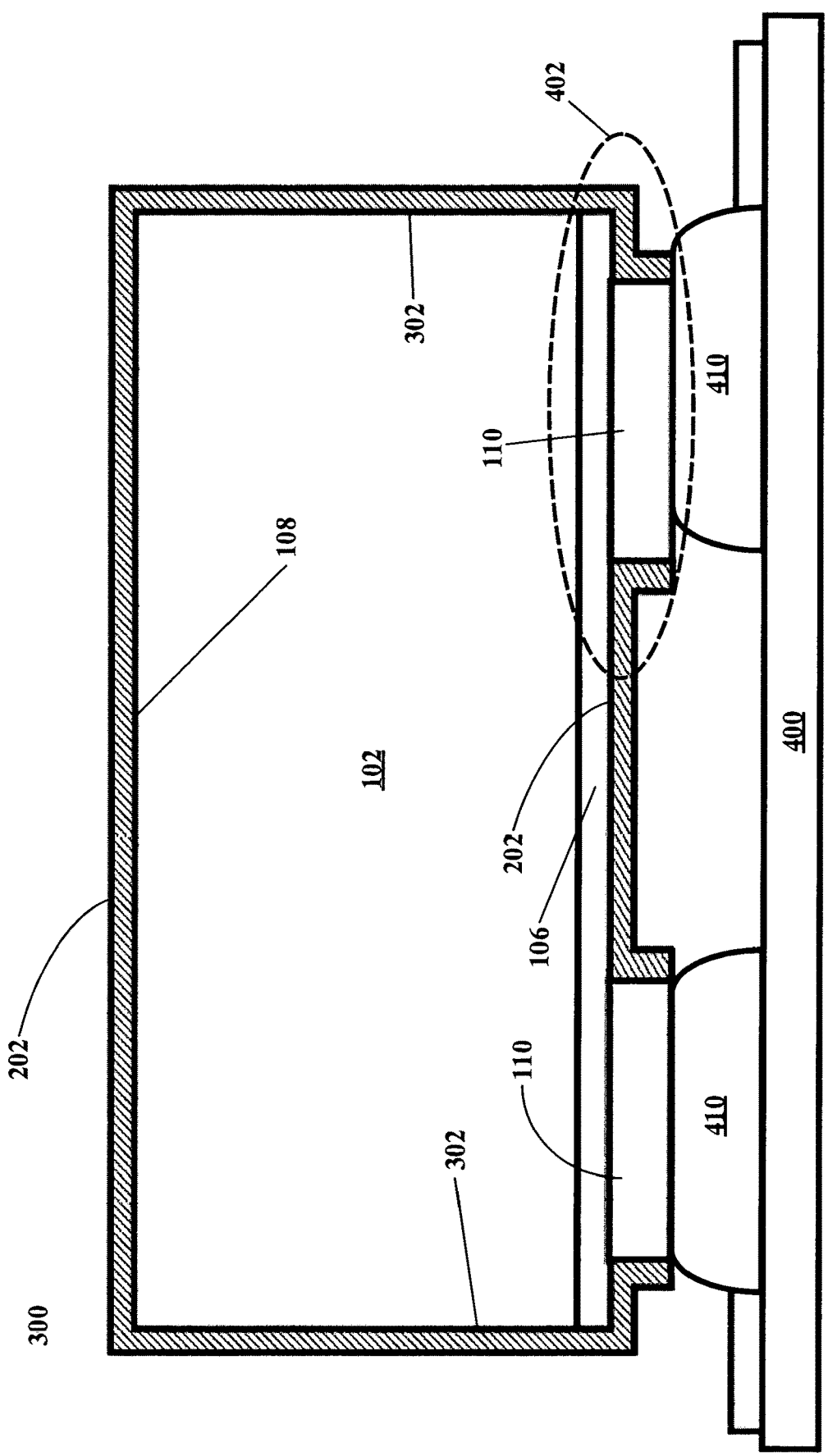
FIG. 4 illustrates a side view of a chip scale package mounted on a support.

The chip scale package 300 as discussed above, may be mounted on a support 400 such as a PCB, as illustrated in FIG. 4. The PCB 400 may comprise electrical contacts 410 for electrical connection to the contacts 110 of the chip scale package 300. The active side 106 of the chip scale package 300 comprising the contacts 110 and the insulating material 202 directly face the PCB 400. In this arrangement, the insulating material 202 on the sidewalls 302 and the active side 106 of the chip prevents any unwanted current paths or current leakage that may occur between the side walls and/or the active side of the chip scale package. In FIG. 4, region 402, shows an example of an unwanted current path between the PCB electrical contacts 410 and the active side 106 and the sidewalls 302 of the chip scale package 300 which may arise due to a misalignment of the chip scale package 300 on the PCB electrical contacts 410 or if solder contacts the side walls of the die. The skilled person will appreciate that the above described arrangement will prevent any unwanted current paths or leakage currents such that the chip scale package 300 may function correctly.

The insulating material may be deposited by low temperature ALD to a thickness which is dependent on the maximum operating voltage of the device. In other words a device with a low maximum operating voltage may have a thinner insulating material layer when compared with a device with a higher maximum operating voltage. The skilled person will see therefore that the thickness of the insulating material is directly proportional to the maximum operating voltage.

By way of example, the typical breakdown voltage of an $Al_2O_3$ insulating material is more than 6 MV/cm (or 0.6V/nm). Therefore a thickness of 20 nm $Al_2O_3$ insulating may have a breakdown voltage of approximately 12V.

The typical range of insulating material layer thickness will be in the range of 1 nm to 100 nm such that the requirement of total package volume is maintained as nearly identical to the volume of the die. Preferably the thickness of the insulating material will be in the tens of nm.

For example, in a typical 0402 (or 01005) device package the volume is defined as 200 µm×400 µm×100 µm. If, for example, the deposited insulating material layer has a thickness of 0.1 µm, in order to maintain the device volume of 0402 package, the die volume must consequently reduce by approximately 0.25%. On the other hand if a known 20 µm epoxy-layer is used, the die volume must be decreased by more than 40%, in order to maintain the 0402 volume. As a result therefore, the present arrangement allows for increased die size in a defined package volume which may lead to increased current carrying capacity for a particular package standard, such as 0402.

The insulating material may be an inorganic insulating material. The insulating material may for example be a metal oxide such as $Al_2O_3$ and may be deposited onto the semiconductor die, as discussed above, by ALD. A discussion of specific ALD processes is not within the scope of the present disclosure as the skilled person will be aware that ALD processes may allow for deposition of near perfect layers by sequential self-limiting surface reactions.

The insulating material may for example, be a layer of $Al_2O_3$ deposited by ALD followed by a layer of $TiO_2$ also deposited by ALD. Alternatively the insulating material may be multiple alternating layers of $Al_2O_3$ and $TiO_2$ beginning with an $Al_2O_3$ layer and finishing with a $TiO_2$ layer top layer. $Al_2O_3$ alone may be corroded by moisture, therefore the inclusion of the $TiO_2$ layer improves corrosion resistance because $TiO_2$ is chemically more stable than $Al_2O_3$.

In addition, to an insulating material of $Al_2O_3$ or $Al_2O_3$ and $TiO_2$ as described above an additional layer may be deposited as a final layer. For example the additional layer may be chosen dependent on the application of the chip scale package, and that layer may provide for additional surface properties such as a hydrophobic surface with may be beneficial to prevent ingress of moisture to the semiconductor die. Additionally, the additional layer may provide enhanced optical properties which could improve optical recognition of the chip scale package in machine vision systems used for optical recognition in surface mount pick and place processes. The additional layer may also provide protection against solder reflux agents or other chemical agents.

By way of example, the additional layer may be an inorganic dielectric layer such as $Si_3N_4$. The additional layer may be deposited to a thickness of approximately 1 μm by a process other than ALD, such as plasma enhanced deposition or plasma chemical vapour deposition (PCVD), provided that the additional layer is deposited at a temperature no greater than the maximum temperature rating of the carrier.

In addition to the additional layer mentioned above, an additional insulating material of $Al_2O_3$ or $Al_2O_3$ and $TiO_2$ may be deposited as a final layer. In general the deposition rate of ALD is lower than that of plasma CVD and as such it may be more cost effective to produce one part of the insulation layer using CVD.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A semiconductor chip scale package comprising:
   a semiconductor die, the semiconductor die comprising: a first major surface opposing a second major surface; a plurality side walls extending between the first major surface and the second major surface;
   a plurality of electrical contacts arranged on the second major surface of the semiconductor die, each of the plurality of electrical contacts having a carrier-facing bottom surface; and
   an inorganic insulating material arranged on the plurality of side walls and on the first major surface, wherein the inorganic insulating material comprises a layer of the inorganic insulating material having a thickness in the range of from about 1 nm to about 100 nm,
   wherein the entire carrier-facing bottom surface of all of the plurality of electrical contacts of the semiconductor chip scale package are free of any of the inorganic insulating material.

2. The semiconductor chip scale package of claim 1, wherein the inorganic insulating material comprises a metal oxide material.

3. The semiconductor chip scale package of claim 2, wherein the inorganic insulating material comprises an aluminium oxide.

4. The semiconductor chip scale package of claim 2, wherein the layer of inorganic insulating material comprises a plurality of the layers of the inorganic insulating material, wherein the plurality of layers of the inorganic insulating material comprise an $Al_2O_3$ layer and a $TiO_2$ layer.

5. The semiconductor chip scale package according to claim 4, wherein the plurality of inorganic insulating layers comprise an arrangement of alternating $Al_2O_3$ layers and $TiO_2$ layers.

6. The semiconductor chip scale package of claim 1, wherein the inorganic insulating material is arranged on the second major surface such that the electrical contacts are free of the inorganic insulating material.

7. The semiconductor chip scale package of claim 1, wherein the second major surface is free of inorganic insulating material.

8. The semiconductor chip scale package of claim 1, wherein the thickness of the layer of inorganic insulating material is proportional to an operating voltage of the semiconductor die.

9. The semiconductor chip scale package of claim 1, wherein the layer of inorganic insulating material is formed as a conformal layer on the semiconductor die by atomic layer deposition or low temperature PECVD.

10. An array of semiconductor chip scale packages of claim 1, comprising a plurality of chip scale packages formed on a carrier, wherein the electrical contacts are in contact with the carrier.

11. The semiconductor chip scale package of claim 1, wherein the thickness of the layer of the inorganic insulating material are in the range of from about 1 nm to about ten nm.

12. The semiconductor chip scale package of claim 1, further comprising an additional layer arranged on the layer of inorganic insulating material.

13. The semiconductor chip scale package of claim 12, wherein the additional layer comprises a layer property selected from the group consisting of:
   a hydrophobic layer property;
   a layer having an enhanced optical layer property;
   a chemically protective layer property;
   an inorganic dielectric layer property; and
   any combination of layer properties thereof.

14. The semiconductor chip scale package of claim 12, further comprising
   another insulating layer arranged on the additional layer.

15. The semiconductor chip scale package of claim 1, further comprising:

each electrical contact of the plurality of electrical contacts has a plurality of side surfaces, and
the plurality of side surfaces of each of the plurality of electrical contacts are entirely covered by the inorganic insulating material.

\* \* \* \* \*